United States Patent

Matsuzawa et al.

(10) Patent No.: US 6,677,108 B2
(45) Date of Patent: Jan. 13, 2004

(54) METHOD FOR LIGHT EXPOSURE

(75) Inventors: Nobuyuki Matsuzawa, Kanagawa (JP); Shigeo Irie, Kyoto (JP)

(73) Assignees: Sony Corporation, Tokyo (JP); Matsushita Electric Industrial Co., Ltd., Osaka (JP)

(*) Notice: Subject to any disclaimer, the term of this patent is extended or adjusted under 35 U.S.C. 154(b) by 60 days.

(21) Appl. No.: 09/907,345

(22) Filed: Jul. 17, 2001

(65) Prior Publication Data

US 2002/0119401 A1 Aug. 29, 2002

(30) Foreign Application Priority Data

Jul. 21, 2000 (JP) .................... P2000-221289

(51) Int. Cl.$^7$ ................................. G03C 5/56
(52) U.S. Cl. .............. 430/311; 430/322; 430/396; 430/966; 430/967; 430/270.1
(58) Field of Search ............... 430/311, 322, 430/396, 966, 270.1, 967

(56) References Cited

U.S. PATENT DOCUMENTS

| | | | |
|---|---|---|---|
| 5,510,230 A | * | 4/1996 | Tennant et al. ............. 430/325 |
| 6,177,231 B1 | * | 1/2001 | Ishii et al. ................ 430/273.1 |
| 6,517,993 B2 | * | 2/2003 | Nakamura et al. ........ 430/270.1 |

* cited by examiner

Primary Examiner—Mark F. Huff
Assistant Examiner—Daborah Chacko-Davis
(74) Attorney, Agent, or Firm—Sonnenschein, Nath & Rosenthal LLP

(57) ABSTRACT

A light exposure method in which, when a resist layer is selectively exposed to one of X-rays containing soft X-rays, vacuum ultraviolet light rays and ultraviolet rays containing extreme ultraviolet light rays for patterning the resist layer to a pre-set shape, a high molecular material having pre-set oxygen content ratio ($n_o$) and density ($\rho$) is applied to form a resist layer having a film thickness not less than 250 nm. Since the high molecular material having the pre-set oxygen content ratio ($n_o$) and density ($\rho$) is used, a resist pattern of a better shape may be obtained even if the resist layer is of an increased thickness of not less than 250 nm. Since the film thickness of the resist layer is not less than 250 nm, it is possible to construct a lithographic process superior in etching resistance to realize ultra-fine machining than was heretofore possible.

7 Claims, 2 Drawing Sheets

METHOD FOR LIGHT EXPOSURE

RELATED APPLICATION DATA

The present and foregoing application claim priority to Japanese Application No. P2000-221289 filed Jul. 21, 2000.

All of the foregoing applications are incorporated herein by reference to the extent permitted by law.

BACKGROUND OF THE INVENTION

1. Field of the Invention

This invention relates to a light exposure method for performing extremely fine machining in, for example, the field of semiconductors.

2. Description of Related Art

In e.g., the filed of semiconductors, in order to cope with the tendency towards higher integration of semiconductor devices, it is becoming incumbent to establish a new process technique enabling the machining of an extremely fine pattern of, for example, 0.1 μm or less.

For machining a fine pattern, the so-called lithographic technique is indispensable. Thus, in order to enable the ultra-fine machining through improvement in optical resolution to cope with the tendency towards shorter wavelengths of the exposure light, development of a new light exposure technique employing the extreme ultraviolet (EUV) in the vicinity of 7 to 16 nm wavelength, in addition to the ultraviolet light such as KrF (krypton fluorine) or ArF (argon fluorine) or the conventional mercury lamp, is proceeding energetically.

However, in the wavelength range of the extreme ultraviolet (EUV), the light undergoes marked optical absorption with the routine resist material, such that the illuminated light fails to reach a lower portion of the resist layer. The result is that a resist pattern of an optimum rectangular shape cannot be prepared, thus deteriorating the resist pattern.

Such deterioration in the resist pattern obstructs the ultra-fine machining, and hence it is desired to suppress such deterioration. Although it is currently practiced to reduce the film thickness of the resist layer to e.g., less than 150 nm to improve the light transmittance of the resist layer in its entirety. However, if the film thickness of the resist layer is reduced, etching resistance tends to be insufficient.

SUMMARY OF THE INVENTION

It is therefore an object of the present invention to provide a light exposure method which resolves the problem of light transmittance of the resist layer in the wavelength range of the extreme ultraviolet (EUV) to enable finer machining than was heretofore possible.

According to the present invention, there is provided a light exposure method for selectively exposing a resist layer with one of X-rays containing soft X-rays, vacuum ultraviolet light rays and ultraviolet rays containing extreme ultraviolet light rays for patterning the resist layer to a pre-set shape, in which the method includes the step of employing, as a high molecular material forming the resist layer, a high molecular material having the oxygen content ratio ($n_o$) and density ($\rho$) satisfying the following equations (1) and/or (2):

$$\rho \leq \frac{3.66 \times \{12.011 \times (1-n_0)/2 + 15.9994 \times n_0 + 1.00794 \times (1-n_0)/2\}}{32.4297 \times (1-n_0)/2 + 126.595 \times n_0 + 1.3607 \times (1-n_0)/2} \quad (1)$$

$$\rho \leq \frac{3.66 \times \{12.011 \times (1-n_0)/3 + 15.9994 \times n_0 + 1.00794 \times (1-n_0) \times 2/3\}}{32.4297 \times (1-n_0)/3 + 126.595 \times n_0 + 1.3607 \times (1-n_0)2/3} \quad (2)$$

and forming the high molecular material as a coating to form the resist layer having a film thickness not less than 250 nm.

It should be noted that the oxygen content ratio ($n_o$) is based not on the weight ratio but on the ratio of the numbers of atoms.

In a high molecular material forming the resist layer, the presence of oxygen atoms is indispensable for manifestation of resist characteristics. In the high molecular material, the portion which undergoes chemical reactions due to the irradiated light to cause changes in the physical properties of an irradiated portion and an unirradiated portion to manifest resist characteristics is necessarily a group containing oxygen, such as ester groups, phenol groups, alcoholic groups and carboxylic groups.

In the wavelength range of the extreme ultraviolet (EUV) light rays, optical absorption for oxygen is larger than that for carbon or hydrogen and accounts for the lowering of the light transmittance of the high molecular material. The value of optical absorption for one oxygen atom is of an extremely large value which is approximately three times that for one carbon atom and approximately 50 to 100 times that for one hydrogen atom.

In the present invention, since the high molecular material having the pre-set oxygen content ratio $n_o$ and density $\rho$ is used, the proportion of the oxygen atoms in the constituent atoms of the high molecular material is of a relatively small value. Thus, the optical absorption in the entire high molecular material is suppressed, such that, if the film thickness of the resist layer is of a thicker value of, for example, 250 nm, sufficient light transmittance may be achieved in manifesting resist characteristics.

Moreover, since the film thickness of the resist layer is set to not less than 250 nm, the etching resistance of the resist layer can be improved.

According to the present invention, in which the high molecular material having the pre-set oxygen content ratio $n_0$ and density $\rho$ is used, it is possible to produce a resist pattern of an optimum shape even with the thick resist layer having a film thickness not less than 250 nm. In addition, since the film thickness of the resist layer is set to not less than 250 nm, it is possible to construct a lithographic process having excellent etching resistance to assure ultra-fine machining more intricate than was heretofore possible.

DESCRIPTION OF THE PREFERRED EMBODIMENTS

Figure 1:
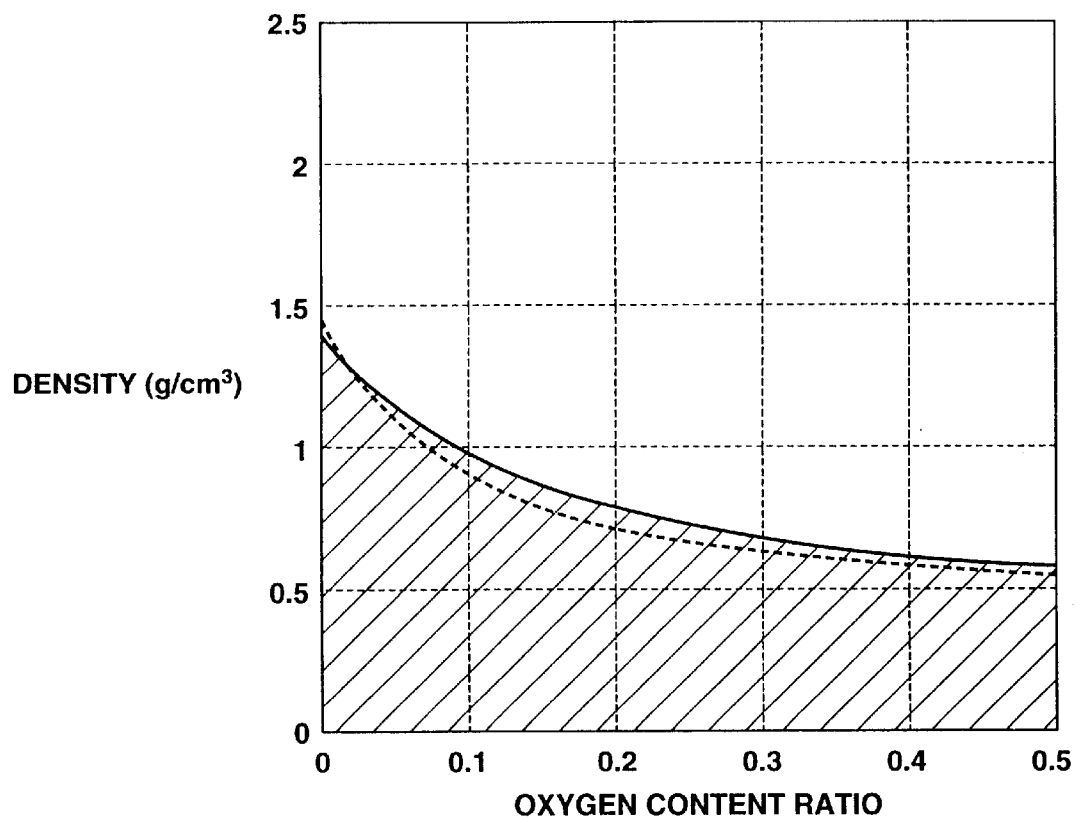
FIG. 1 is a graph showing the relation between the oxygen content ratio ($n_o$) and the density ($\rho$) for achieving the desired light transmittance.

Referring to the drawings, a preferred embodiment of a light exposure method according to the present invention will be explained in detail.

The light exposure method according to the present invention; is applied to the machining of an ultra-fine pattern in e.g., a semiconductor device. As typical of the machining process for an ultra-fine pattern, the process includes the steps of forming a resist-layer exhibiting photosensitivity by coating on a substrate, selectively exposing the resist layer with soft X-rays, vacuum ultraviolet light rays and ultraviolet rays containing extreme ultraviolet light rays for light sensitization and patterning the resist layer to a pre-set pattern by development.

Although X-rays of an optional wavelength may be used as X-rays for light exposure, light exposure with a higher resolution than was possible heretofore may be achieved by employing extreme ultraviolet (EUV), also called soft X-rays, with a specified wavelength of 7 to 16 nm.

For light exposure, light exposure by contraction projection is executed by exploiting a contraction projection optical system.

The high molecular material used for the resist layer includes a novolak resin, a polyhydroxy styrene resin, an acrylic resin, a siloxane resin having an ester group, a carboxylic group, a sil serqui oxanoic resin or a polycyclo olefinic resin, as its skeleton structure.

The high molecular material used for this resist layer desirably includes an aromatic ring, such as a benzene ring. By employing the high molecular material including the aromatic ring, such as a benzene ring, it is possible to improve the etching resistance of the resist layer.

In these resins, forming the basic skeleton, the portions undergoing chemical reactions due to the irradiated light to change the physical properties of the irradiated portion from those of the non-irradiated portion to demonstrate resist characteristics are the oxygen-containing groups, such as ester-, phenol-, alcohol- or carboxylic groups.

However, the optical absorption in the wavelength range of the extreme ultraviolet (EUV) becomes smaller in the order of F, O, C, Si and H, that is F>O>C>Si>H. That is, the fact that the high molecular material contains oxygen is not meritorious from the viewpoint of optical absorption in the wavelength of the extreme ultraviolet (EUV) of the high molecular material.

So, according to the present invention, the content ratio of oxygen atoms contained in the high molecular material is prescribed to increase the content ratios of carbon and hydrogen atoms relative to oxygen atoms contained in the high molecular material to effect relative dilution of the oxygen atoms to lower the absorption in the wavelength range of the extreme ultraviolet (EUV) of the high molecular material forming the resist layer.

Specifically, a high molecular material having the oxygen content ratio ($n_o$) and density ($\rho$) which satisfy the following equation (1) and/or (2): following equations (1) and/or (2):

It should be noted that the oxygen content ratio ($n_o$) is not based on the weight ratio but on the ratio of the numbers of atoms.

With the high molecular material having the oxygen content ratio ($n_o$) and density ($\rho$) in meeting with the equations (1) and/or (2), the ratio of oxygen atoms in atoms making up a high molecular material is of a relatively small value, so that optical absorption of the high molecular material in its entirety, in particular the absorption in the extreme ultraviolet (EUV) range, is suppressed. So, the resist layer constructed using this high molecular material is able to achieve sufficient light transmittance in displaying the resist characteristics. If, for example, the film thickness is not less than 250 nm, the light transmittance exceeding 40% may be achieved.

If the resist layer is formed using a high molecular material having the oxygen content ratio ($n_o$) and density ($\rho$) not satisfying the equations (1) nor (2), the light transmittance of the resist layer is 40% or less, so that an optimum rectangular resist pattern cannot be achieved.

Moreover, according to the present invention, since the film thickness of the resist layer is not less than 250 $\mu$m, the etching resistance of the resist layer can be improved reliably. If the film thickness of the resist layer is less than 250 nm, the etching resistance of the resist layer is deteriorated, thus giving rise to the risk that a resist pattern of an optimum shape cannot be acquired following the etching.

According to the present invention, the high molecular material forming the resist layer desirably has a linear absorption coefficient in the X-ray wavelength range (extreme ultraviolet light wavelength range in case of using extreme ultraviolet light) is 3.80 $\mu m^{-1}$.

If the linear absorption coefficient is not higher than 3.80 $\mu m^{-1}$, the transmittance of the resist layer is of a sufficiently high value of approximately not less than 30% for a film thickness of 300 nm. If the linear absorption coefficient exceeds 3.80 $\mu m^{-1}$, and the transmittance value is smaller than this value, there is a risk that resist pattern of an optimum rectangular shape cannot be generated, with the illuminated light not sufficiently reaching the lower part of the resist layer.

EXAMPLES

The present invention will now be explained with reference to specified Examples.

Relation Between Oxygen Content Ratio ($n_0$) and Density ($\rho$) of the High Molecular Material and the Light Transmittance The light absorption intensity of the high molecular material in the wavelength range of the extreme ultraviolet (EUV) is determined by the density of the high molecular $$\rho \leq \frac{3.66 \times \{12.011 \times (1-n_0)/2 + 15.9994 \times n_0 + 1.00794 \times (1-n_0)/2\}}{32.4297 \times (1-n_0)/2 + 126.595 \times n_0 + 1.3607 \times (1-n_0)/2} \quad (1)$$

$$\rho \leq \frac{3.66 \times \{12.011 \times (1-n_0)/3 + 15.9994 \times n_0 + 1.00794 \times (1-n_0) \times 2/3\}}{32.4297 \times (1-n_0)/3 + 126.595 \times n_0 + 1.3607 \times (1-n_0)2/3} \quad (2)$$

is used as the high molecular material forming the resist layer. The high molecular material then is applied as a coating to form a resist layer having a film thickness not less than 250 nm.

material and the composition of atoms contained in the high molecular material. There are three sorts of atoms contained in a routine high molecular material forming a resist layer, referred to below as the resist material, namely oxygen atoms, carbon atoms and hydrogen atoms. In the resist material, there are contained no carbon triplet bonds.

If it is assumed that no polycyclic aromatic rings larger than benzene rings are contained in the routine resist material, the composition of the oxygen atoms, carbon atoms and hydrogen atoms in the routine resist material is $C_{(1-n)m}O_nH_{1-m+n(m-1)}$, where $0 \leq n \leq 1$ and $1/3 \leq m \leq 1/2$. If $m=1/3$, C:H=1:2 so that the composition is a certain alkane containing oxygen. If $m=1/2$, C:H=1:1, with the composition then being an alkene or a benzene derivative containing oxygen atoms.

In actuality, in a hydrocarbon which proves a resist material, all carbon atoms are not formed by $sp_2$ or $sp_3$ carbon, but $sp_3$ carbon and the $sp_2$ carbon exist together. This accounts for the above relation of $1/3 \leq m \leq 1/2$ for m.

The present inventors derived the linear absorption coefficient of the resist layer theoretically when both the oxygen content ratio ($n_o$) and density ($\rho$) are changed, in accordance with the following method, under the above-described conditions, to calculate the linear absorption coefficient.

As the absorption coefficient per each atom at a wavelength of 13 nm, the value given by the Atomic Data and Nuclear Tables (Henke, B. L.; Gullikson, E. M; Davis, J. C 1993, 54,181) was used.

As for PMMA (polymethyl methacrylate), it has been known that the above value coincides extremely satisfactorily with the linear absorption coefficient at a wavelength of 13 nm as found from an experimental density value [J. Vac. Sci. Technol. B (Kubiak, G. D.: Kneedler, E. M.; Hwang, R. Q.: Schulberg, M. T.; Berger, K. W.; Bjorkholm, J. E.; Mansfield, W. M. 1992, 10, 2593)].

As a result, it has been found that, if a high molecular material the oxygen content ratio ($n_o$) and density ($\rho$) of which are in a range shown shaded in FIG. 1, that is in a range satisfying a solid line A and/or a broken line B in FIG. 1, the light transmittance of the resist layer is not less than 40% even if the film thickness is not less than 250 nm. In FIG. 1, the abscissa and the ordinate denote the oxygen content ratio ($n_o$) and density ($\rho$), respectively, with the density unit being g/cm$^3$.

The solid line A stands for the case of $m=1/2$, and is represented by the following equation (1):

$$\rho \leq \frac{3.66 \times \{12.011 \times (1-n_0)/2 + 15.9994 \times n_0 + 1.00794 \times (1-n_0)/2\}}{32.4297 \times (1-n_0)/2 + 126.595 \times n_0 + 1.3607 \times (1-n_0)/2} \quad (1)$$

The solid line B stands for the case of $m=1/3$, and is represented by the following equation (2):

$$\rho \leq \frac{3.66 \times \{12.011 \times (1-n_0)/3 + 15.9994 \times n_0 + 1.00794 \times (1-n_0) \times 2/3\}}{32.4297 \times (1-n_0)/3 + 126.595 \times n_0 + 1.3607 \times (1-n_0)2/3} \quad (2)$$

Thus, it has been found that, with the resist layer formed of a high molecular material having the oxygen content ratio ($n_o$) and density ($\rho$) in meeting with the above equation (1) and/or (2), the light transmittance is not less than 40% even if the film thickness is not less than 250 nm.

Test on Light Exposure

The compounds 1 and 2, shown below, which prove a resist material, was coated by a spin coating method on a substrate, to form a resist layer having a film thickness of 255 nm. As a spin coating apparatus, a spin coater/developer (machine type: Mark8, manufactured by TOKYO ELECTRON KK) was used.

<Compound 1>

A high molecular material having a chemical structure corresponding to a derivative of a polyhydroxy styrene resin with oxygen content ratio ($n_o$): 0.434 density ($\rho$): 1.198 g/cm$^3$ and having a chemical structure as indicated by the chemical formula 1:

<Compound 2>

Polymethyl methacrylate with oxygen content ratio ($n_o$): 0.133 density ($\rho$): 1.275 g/cm$^3$ and having a chemical structure as indicated by the chemical formula 2:

The resist layer, prepared as described above, was exposed to light with the extreme ultraviolet (EUV), using a light exposure device.

Figure 2:
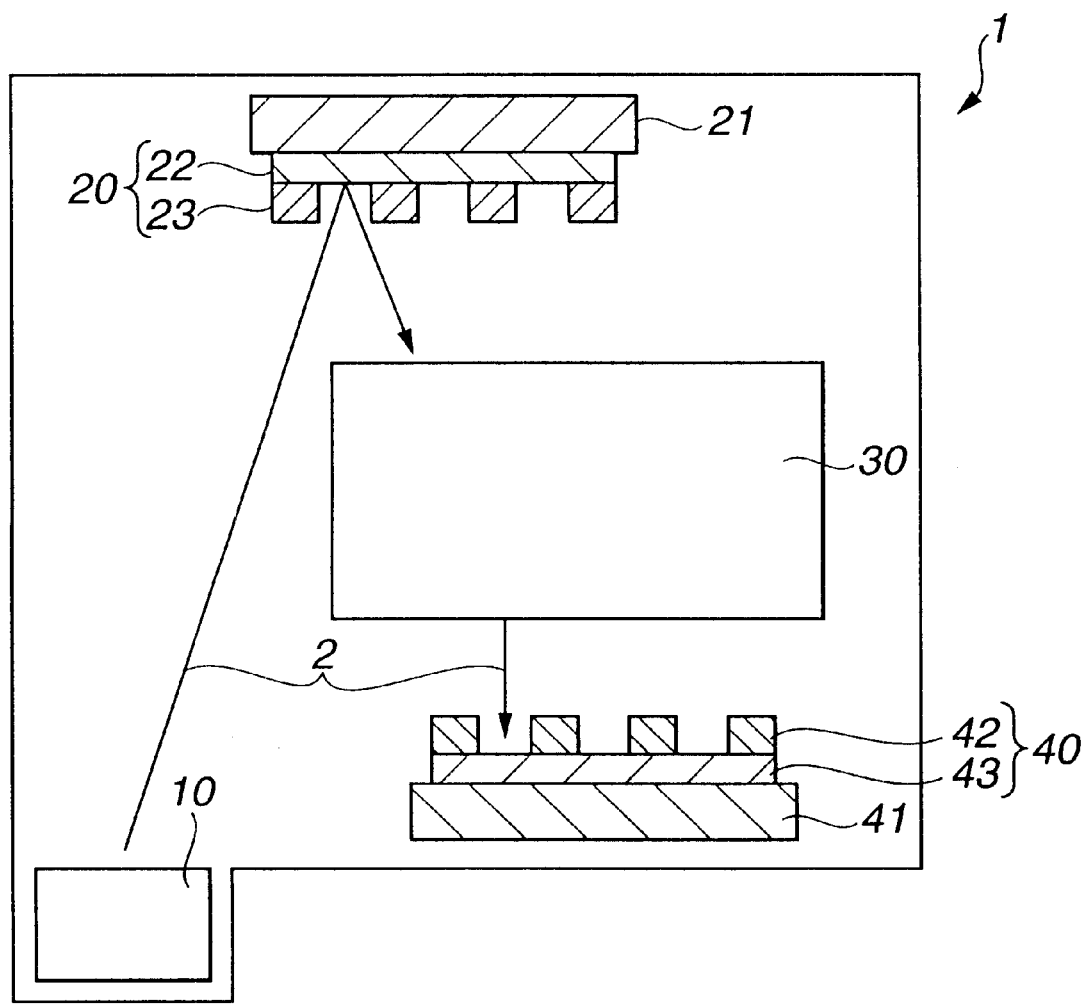
FIG. 2 is a schematic view showing a light exposure device for light exposing a resist layer.

The light exposure device 1 is made up of a light source 10, a reflection mask 20, an operating stage 21, a reflection optical system 30, a substrate 40 and an operation stage 41, as shown in FIG. 2.

Within this light exposure device 1, the light radiated from a storage ring, not shown, forming the light source 10, or the extreme ultraviolet (EUV) rays 2, generated from a plasma X-ray source, not shown, are reflected by a reflection type mask 20, a reflecting surface 22 of which is formed by a molybdenum/silicon multi-layer film. The light reflected was transmitted through a reflecting optical system 30 formed by plural reflecting mirrors, the reflecting surfaces of which are similarly formed by molybdenum/silicon multi-layer films. A mask pattern, thus formed on the reflection type mask 20, is transcribed with a multiplication factor of 1/5 on the substrate 40 to effect light exposure of the resist layer 42.

Since the wavelength of the extreme ultraviolet (EUV) 2 is of an extremely short length of 13 nm, the mask and the optical system are not the conventional transmission mask nor a reflecting optical system. On the contrary, a reflection type mask 20, the reflecting surface 22 of which is a multi-layer film comprised of alternate molybdenum and silicon layers, each a few mm in thickness, having the reflectance to light of the wavelength in the vicinity of 13 nm, with the number of the respective layers being on the order of 40, and a reflection optical system 30 having a reflecting mirror, the reflecting surface of which is a multi-layer film comprised of alternate molybdenum and silicon layers, each a few mm in thickness, with the number of the respective layers being on the order of 40, are used.

The pattern on the reflection type mask 20 is made up of the reflecting surface 22, comprised of the molybdenum/ silicon multi-layer film, and an absorptive surface 23, formed of a extreme ultraviolet absorber, such as tantalum. The extreme ultraviolet light rays 2, incident on the reflection type mask 20, undergoes light intensity differential between the light intensity on the reflecting surface 22 and that on the light absorbing surface 23. The information on this light intensity differential is reflected in the resist layer 42 formed on the substrate 40 on the downstream side of the reflection optical system 30, that is on a silicon substrate 43. The result is that a desired pattern is formed in the resist layer 42.

For example, there is formed a line-and-space pattern on the reflection mask 20, with the tantalum line width being 300 nm and with the space width of the molybdenum/silicon multi-layer film being 300 nm. The tantalum height is 100 nm to assure contrast against the reflecting surface 22 being not less than 1000. This reflection mask 20 is transcribed on the substrate 40 carrying the resist layer 42, as a result of which a 60 nm line-and-space pattern could be formed with the exposure light volume of approximately 50 mJ/cm$^2$ even though the resist layer 42 is of a thicker thickness of 255 nm.

The cross-section of the resist layer 42, thus exposed to light, was observed with a scanning electron microscope (machine type: S4500 manufactured by HITACHI Ltd.). It was found that, if the compound 1 is used as the high molecular material forming the resist layer 42, the resist pattern form is optimum. It was also found that, with the use of the compound 2 as the high molecular material forming the resist layer 42, the shape of the resist pattern was not optimum.

Thus, with the use as the high molecular material forming the resist layer 42, of a high molecular material having the oxygen content ratio ($n_o$) and density ($\rho$) in meeting with the equations (1) and/or (2), such as the compound 1, it is possible for the resist layer 42 to achieve sufficient light transmittance in manifesting resist characteristics, even though the film thickness is thicker than 250 nm, so that a resist pattern having an optimum rectangular shape can be prepared and hence ultra-fine machining more minute than was possible heretofore can be achieved.

Although the foregoing description is directed to a high molecular material, as a derivative of the polyhydroxy styrene resin, in terms of the chemical structure, as the compound 1, the present invention is not limited thereto. For example, any of suitable high molecular materials having the oxygen content ratio ($n_o$) and density ($\rho$) in meeting with the equations (1) and/or (2), and which are based on acrylic, siloxane, silane, vinyl, polyimide or fluorine resins, may be used as the compound 1.

What is claimed is:

1. A light exposure method for selectively exposing a resist layer with light selected from the group consisting of X-rays containing soft X-rays, vacuum ultraviolet light rays, and ultraviolet rays containing extreme ultraviolet light rays, for patterning the resist layer to a pre-set shape, said method comprising the steps of:

employing, as a high molecular material forming said resist layer, a high molecular material having an oxygen content ratio ($n_O$) and density ($\rho$) satisfying at least one of the following equations (1) and (2):

$$\rho \leq \frac{3.66 \times \{12.011 \times (1-n_0)/215.9994 \times n_0 + 1.00794 \times (1-n_0)/2\}}{32.4297 \times (1-n_0)/2 + 126.595 \times n_0 + 1.3607 \times (1-n_0)/2} \quad (1)$$

$$\rho \leq \frac{3.66 \times \{12.011 \times (1-n_0)/3 + 15.9994 \times n_0 + 1.00794 \times (1-n_0) \times 2/3\}}{32.4297 \times (1-n_0)/3 + 126.595 \times n_0 + 1.3607 \times (1-n_0)2/3} \quad (2)$$

and applying said high molecular material to form said resist layer having a film thickness not less than 250 nm.

2. The light exposure method according to claim 1 wherein the linear absorption coefficient of said high molecular material forming said resist layer is not higher than 3.80 $\mu$m$^{-1}$.

3. The light exposure method according to claim 2 comprising the step of exposing said resist layer using extreme ultraviolet light rays.

4. The light exposure method according to claim 3 wherein the wavelength of said extreme ultraviolet light rays is 7 to 16 nm.

5. The light exposure method according to claim 1 wherein the wavelength of said extreme ultraviolet light rays is 7 to 16 nm.

6. The light exposure method according to claim 1 comprising the step of selectively exposing said resist layer using contraction projection employing a contraction projection optical system.

7. The light exposure method of claim 1, comprising the step of:

selectively exposing said resist layer with said light for patterning the resist layer to a pre-set shape.

* * * * *